United States Patent
Thole et al.

(10) Patent No.: US 7,400,152 B2
(45) Date of Patent: Jul. 15, 2008

(54) DIAGNOSTIC METHOD FOR MONITORING A PLUG-IN CONNECTION

(75) Inventors: Michael Thole, Hildesheim (DE); Bert Jannsen, Hildesheim (DE); Thomas Malzahn, Rheine (DE)

(73) Assignee: Robert Bosch GmbH, Stuttgart (DE)

( * ) Notice: Subject to any disclaimer, the term of this patent is extended or adjusted under 35 U.S.C. 154(b) by 288 days.

(21) Appl. No.: 10/581,159

(22) PCT Filed: Nov. 9, 2004

(86) PCT No.: PCT/EP2004/052879

§ 371 (c)(1),
(2), (4) Date: May 31, 2006

(87) PCT Pub. No.: WO2005/062063

PCT Pub. Date: Jul. 7, 2005

(65) Prior Publication Data

US 2007/0152675 A1    Jul. 5, 2007

(30) Foreign Application Priority Data

Dec. 20, 2003   (DE) .................... 103 60 209

(51) Int. Cl.
*G01R 31/02* (2006.01)
*G01R 31/00* (2006.01)

(52) U.S. Cl. .................... 324/537; 324/500
(58) Field of Classification Search .......... 324/537, 324/500

See application file for complete search history.

(56) References Cited

U.S. PATENT DOCUMENTS

| 5,801,661 A | * | 9/1998 | Suzuki .................. 343/702 |
| 6,400,334 B1 | | 6/2002 | Lindenmeier et al. |
| 6,437,577 B1 | | 8/2002 | Fritzmann et al. |
| 6,650,376 B1 | * | 11/2003 | Obitsu .................. 348/730 |

FOREIGN PATENT DOCUMENTS

| JP | 7212285 | 6/1995 |
| JP | 2002319907 | 10/2002 |
| WO | WO 03/049228 | 6/2003 |

* cited by examiner

*Primary Examiner*—Vincent Q. Nguyen
*Assistant Examiner*—Amy He
(74) *Attorney, Agent, or Firm*—Kenyon & Kenyon LLP

(57) ABSTRACT

A diagnostic method for monitoring at least one plug-in connection (4) to an antenna (1), a diagnostic signal is supplied via the antenna signal path toward the antenna (1). The diagnosis signal bypasses an active circuit (31) in the antenna signal path. In the event of a defective plug-in connection (4), the diagnostic signal influences the power supply of the active circuit (31). If the power consumption is outside a predefined window, an error is signaled.

19 Claims, 7 Drawing Sheets

DIAGNOSTIC METHOD FOR MONITORING A PLUG-IN CONNECTION

FIELD OF THE INVENTION

The invention relates to a diagnostic method for monitoring at least one plug-in connection to an antenna, in particular a plug-in connection in the antenna signal path to a window-integrated antenna of a vehicle.

DESCRIPTION OF RELATED ART

It is known to establish a current window for a normal operating range of an active circuit in the antenna signal path of receivers, e.g. radio or TV receivers, for diagnosing plug-in connectors or plug-in connections. An error is signaled when the power consumption is outside the predefined current window.

SUMMARY OF THE INVENTION

The invention is a diagnostic method for monitoring at least one plug-in connection to an antenna, such as a plug-in connection in the antenna signal path to a window-integrated antenna of a vehicle. In accordance with the invention:
- a diagnosis signal is supplied via the antenna signal path toward the antenna,
- the diagnosis signal bypasses an active circuit provided in the antenna signal path;
- the power supply of the active circuit is influenced depending on whether the diagnostic signal experiences an error due to at least one plug-in connection,
- it is detected whether the power consumption of the active circuit is outside a predefined window and, in such a case, an error is signaled.

In contrast to conventional approaches, several plug-in connections can be diagnosed, in particular the plug-in connection/plug-in connector to the window-integrated antenna of a car. In conventional approaches, only one diagnosis is performed for the plug-in connector from the receiver to the impedance transformer, i.e., to the active antenna adapter circuit. The plug-in connection to the window-integrated antenna is not diagnosed or is only diagnosed via a loop having two separate contacts.

A missing windshield contact is easily diagnosed in complex diversity systems using the method according to the present invention. The invention offers the option of monitoring all plug-in connections in different antenna structures, even those of an optionally provided diversity device.

In accordance with the invention, the diagnostic signal(s) is/are supplied to the antenna at the RF antenna terminal of the receiver, i.e., into the RF cable to the antenna. No additional plug-in contacts are therefore needed.

In rear window-integrated antennas, one side of the heating field is always grounded, so that detection is possible via only one plug-in contact.

In separate antenna structures, detection may take place via a bridge in the windshield connector.

BRIEF DESCRIPTION OF THE DRAWINGS

The present invention will be described in greater detail with reference to the following drawings wherein.

DETAILED DESCRIPTION OF THE INVENTION

Figure 1:
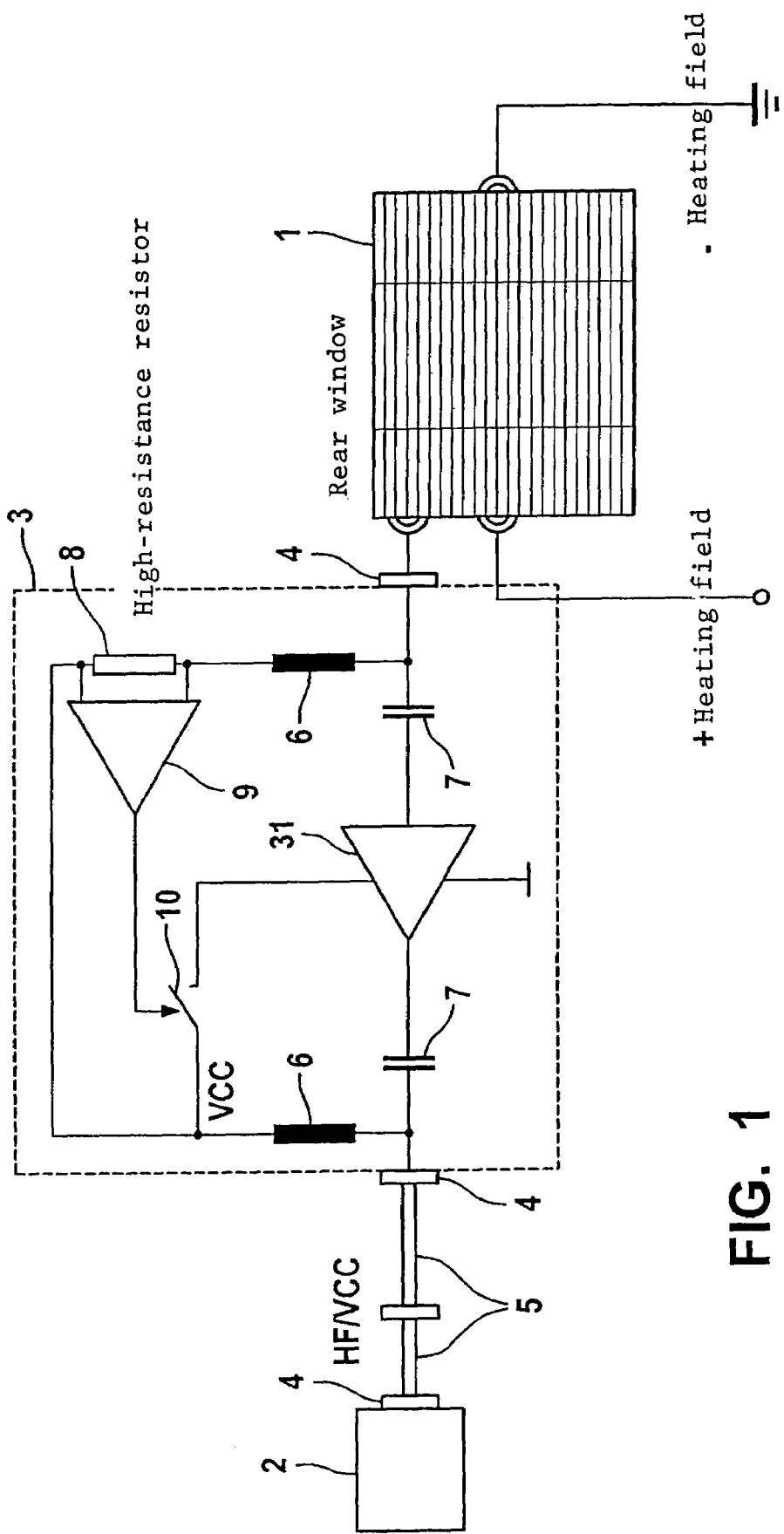
FIG. 1 shows a first exemplary embodiment having an antenna structure grounded on one side.

FIG. 1 shows a rear window 1 of a vehicle, its heating wires for windshield defrosting being used as an antenna. An antenna adapter 3, i.e., an impedance transformer, which is designed in this case as an active amplifier circuit 31, is located in the antenna signal path between antenna and receiver 2, in particular a car radio and/or a TV set. The DC supply signal for active circuit 3 is used simultaneously as a diagnostic signal for plug-in connections 4 in the antenna signal path. The signal travels via RF cable 5 to impedance transformer 3, where it is split off via inductors 6 into the transverse branch and via capacitors 7 into the longitudinal branch, bypassing active circuit 31. At the windshield-side terminal end of active circuit 31, it is added to the RF antenna signal again. In the embodiment of FIG. 1, the diagnostic signal is conducted in the secondary path of active circuit 31 via a diagnostic resistor 8, which has a high resistance in particular of 10 kOhm, for example.

The diagnosis of the correct or existing plug-in contact is detected both as a result of a voltage drop across a diagnostic resistor 8, resulting in a constant current flow, and as a result of an interruption in the power supply. The diagnostic method and the diagnostic device according to the present invention are characterized in that the diagnostic signals are supplied to the RF antenna terminal so that no additional plug-in contacts are needed.

Figure 2:
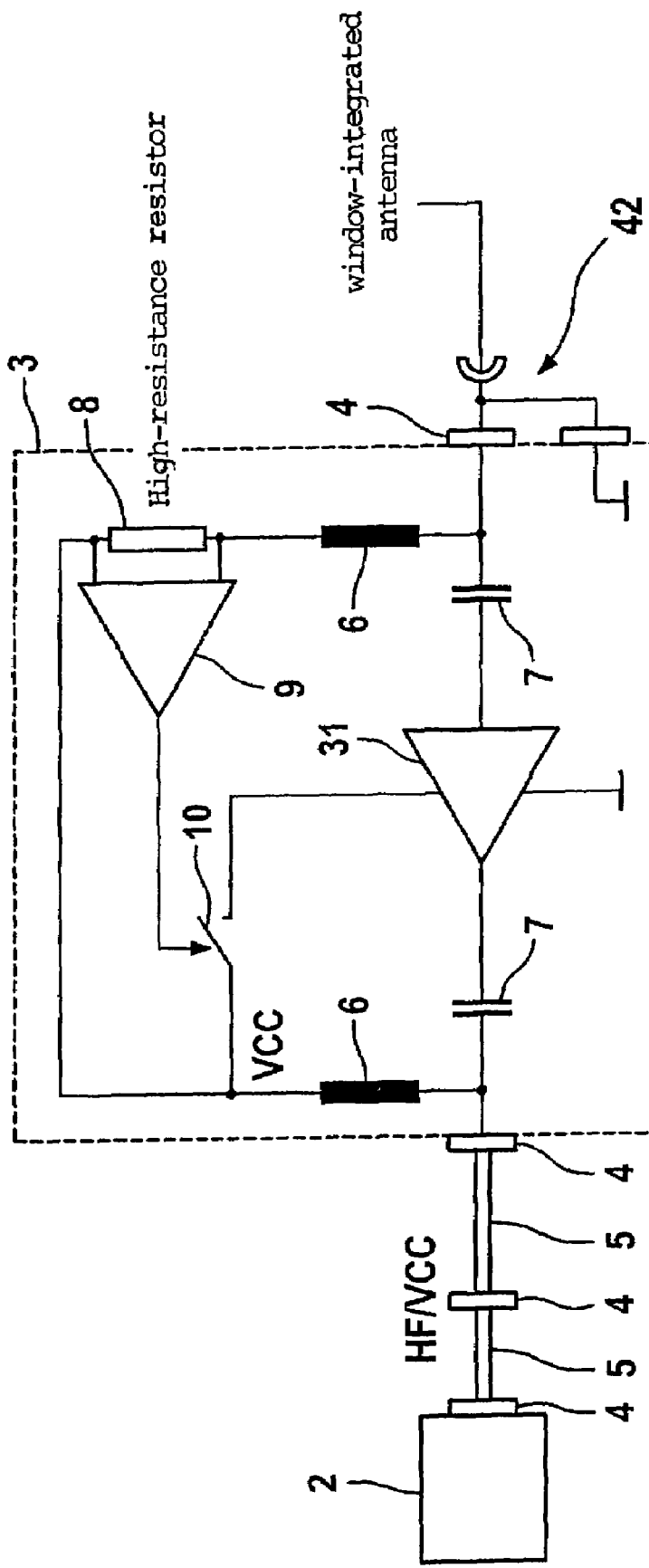
FIG. 2 shows an alternative exemplary embodiment of a generic antenna structure.

If a connection is unplugged or the plug-in contact is not error-free, a circuit breaker 10 for active circuit 31 is activated by analyzer unit 9 connected to diagnostic resistor 8, via the voltage drop across high-resistance diagnostic resistor 8. No current or a very weak current flows due to this shut-off of active circuit 31. This is detected in receiver 2, i.e., the power consumption of active circuit 31 is outside a predefined window and an error is signaled in receiver 2. In the rear window-integrated antenna illustrated in FIG. 1, one side of the heating field is grounded, so that detection is possible here via only one windshield-side plug-in contact. In the case of separate antenna structures according to the exemplary embodiment illustrated in FIG. 2, detection may take place via a bridge 42 to ground in windshield connector 4. The monitored plug-in connections are identified by a solid dark rectangle in all figures.

Figure 3:
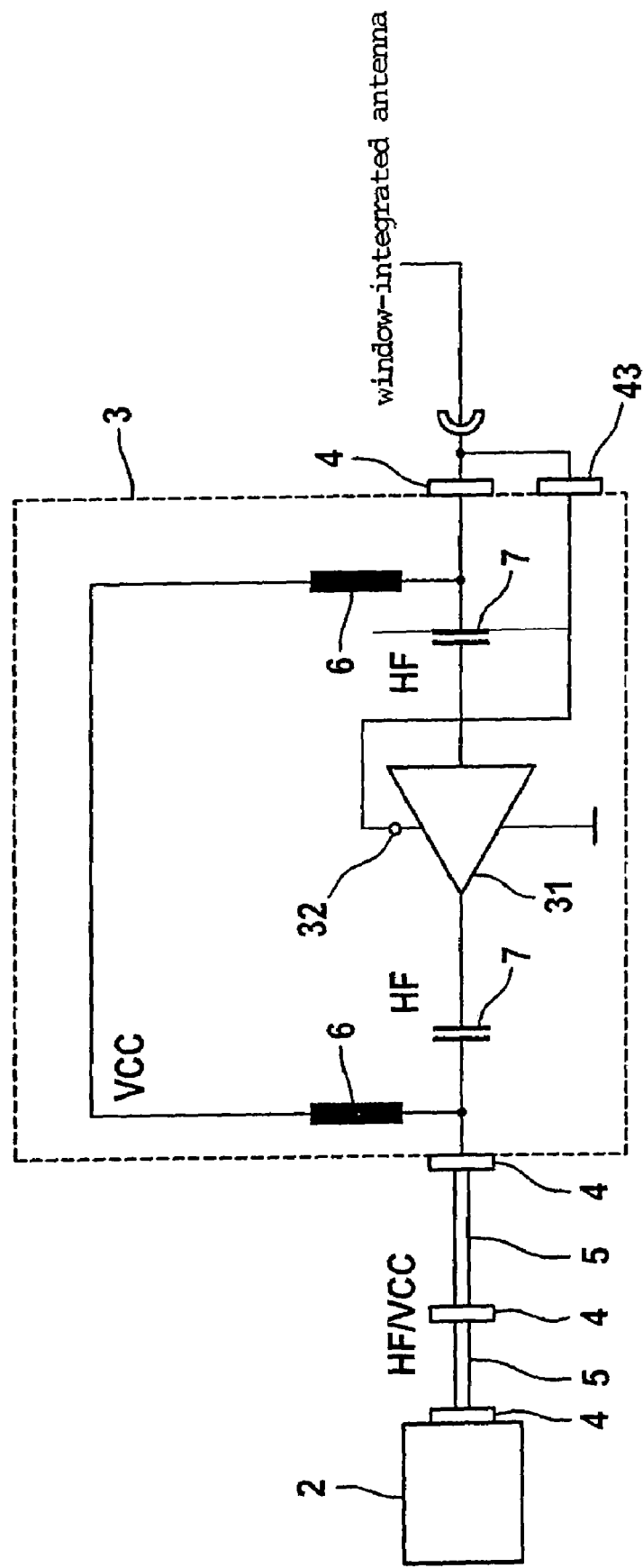
FIG. 3 shows feedback of the diagnostic signal to the power supply of an active circuit.

In the exemplary embodiment according to FIG. 3, diagnostic resistor 8 in the secondary path of active circuit 31 is unnecessary because the diagnostic signal is fed back to power supply terminal 32 of active circuit 31 after passing through the windshield-side plug-in connector via bridge 43.

Figure 4:
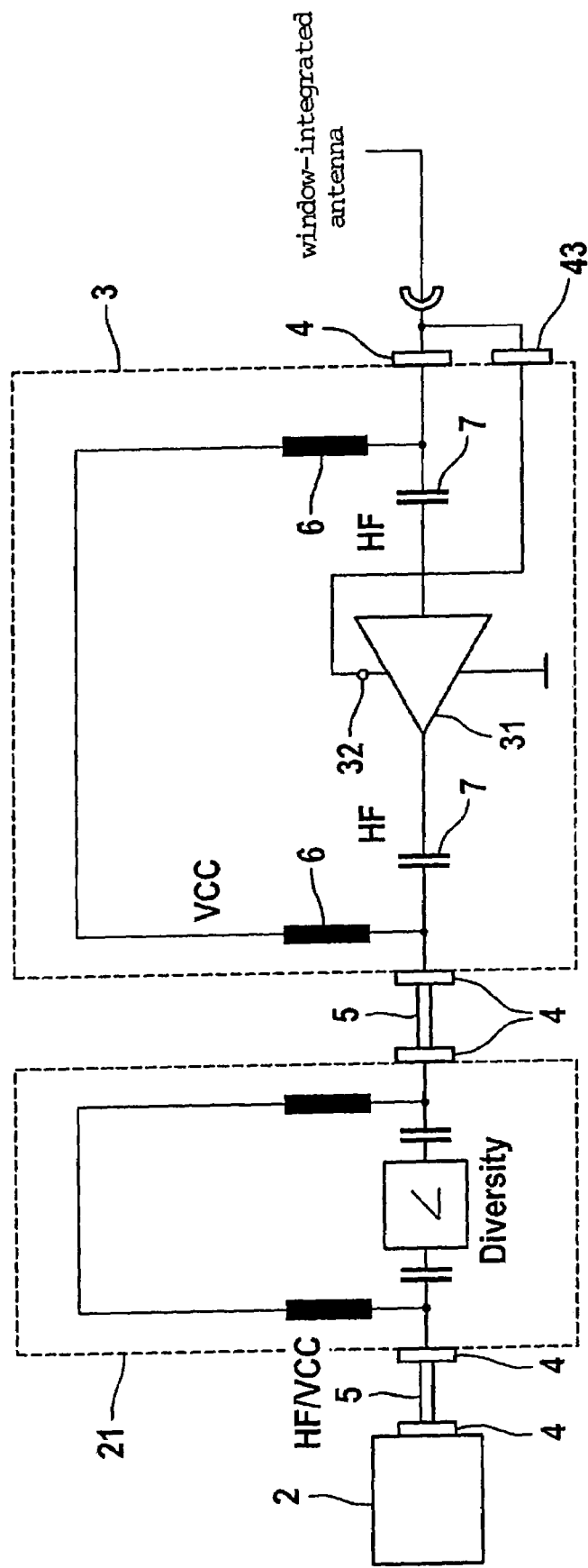
FIG. 4 shows joint monitoring of a diversity device.

In the exemplary embodiment according to FIG. 4, the plug-in connections of diversity device 21 connected upstream from adapter stage 3 are also monitored. Also in this case, the diagnostic signal is phantom-supplied via RF cable 5 of the antenna signal path, is split off at the input of diversity device 21, bypasses the active circuit of diversity device 21, and is added again to the RF signal at the output.

Figure 5:
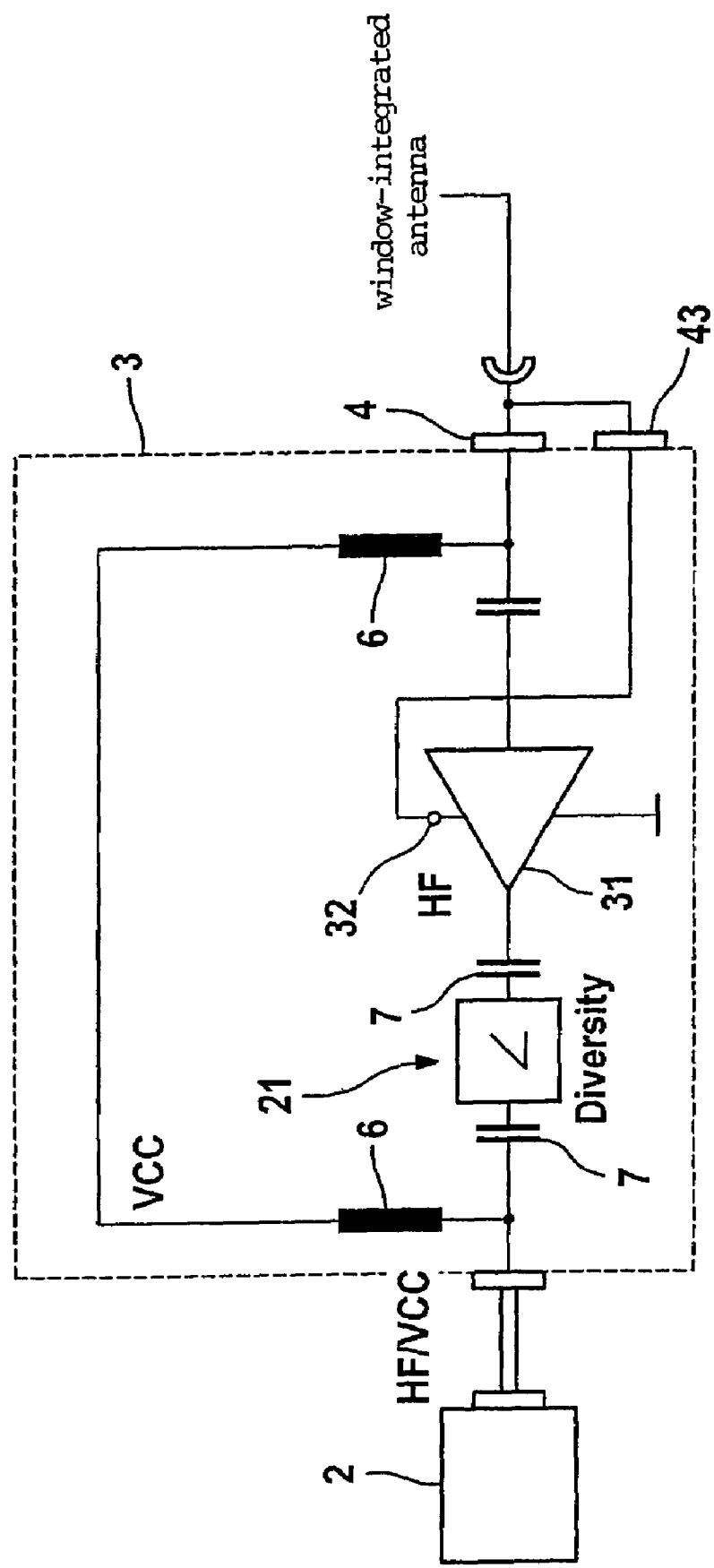
FIG. 5 shows an alternative embodiment for joint monitoring of a diversity device.

FIG. 5 shows a diversity device 21 having an integrated (downstream) adapter stage. The diagnostic signal is split off at the input of diversity device 21, bypasses the active circuit(s) of the diversity device and adapter stage 3 to the windshield-side output of the adapter stage, and is added again to the RF signal.

Figure 6:
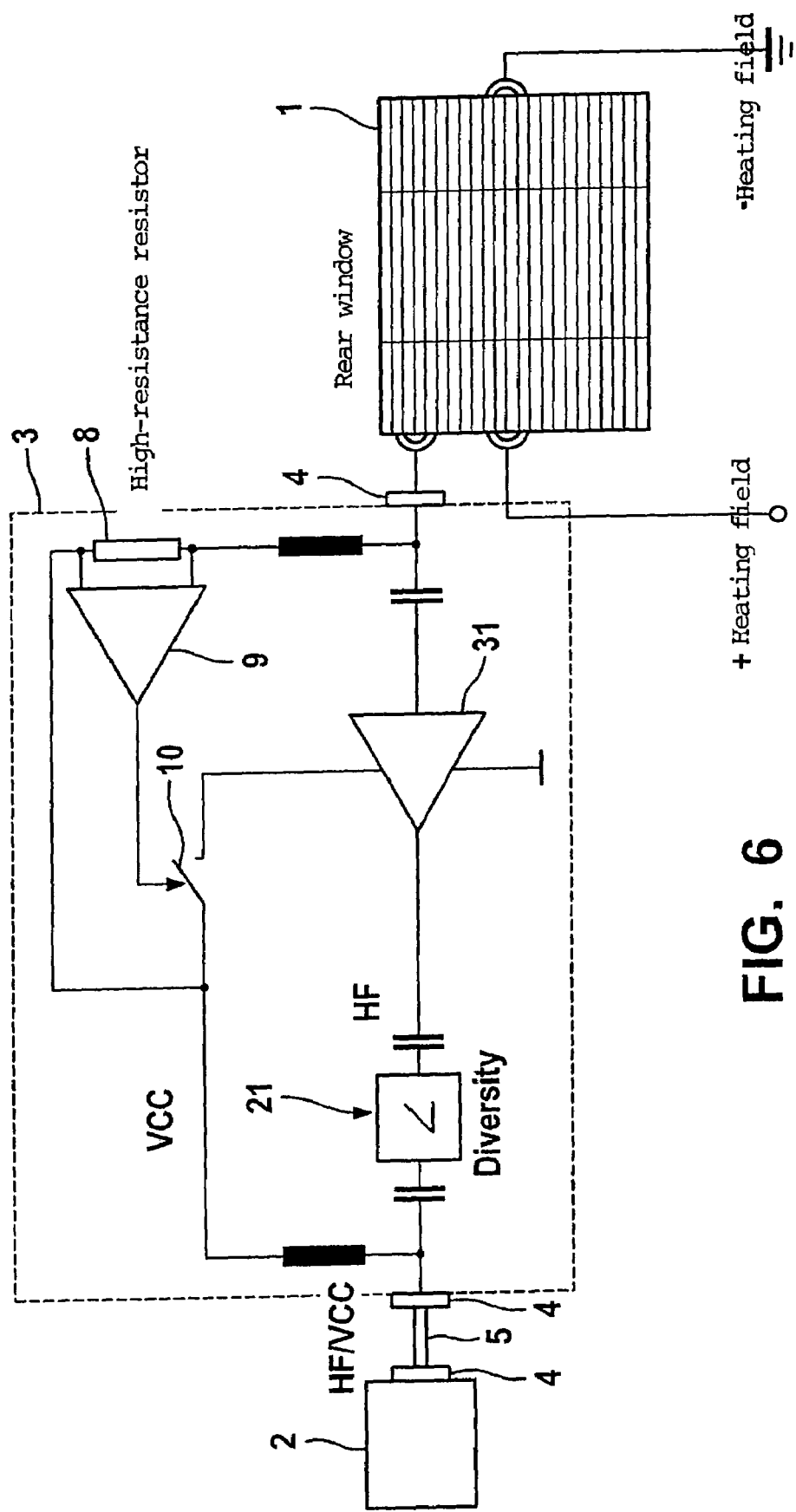
FIG. 6 shows an alternative to the joint monitoring of a diversity device and analysis via a diagnostic resistor.

FIG. 6 shows an alternative to FIG. 5 having an integrated diversity device. In this case, as in FIG. 1, diagnostic resistor 8 having analyzer unit 9 and power supply interrupter 10 is provided as an alternative to the feedback of the diagnostic signal via a bridge at the windshield-side plug-in connector.

Figure 7:
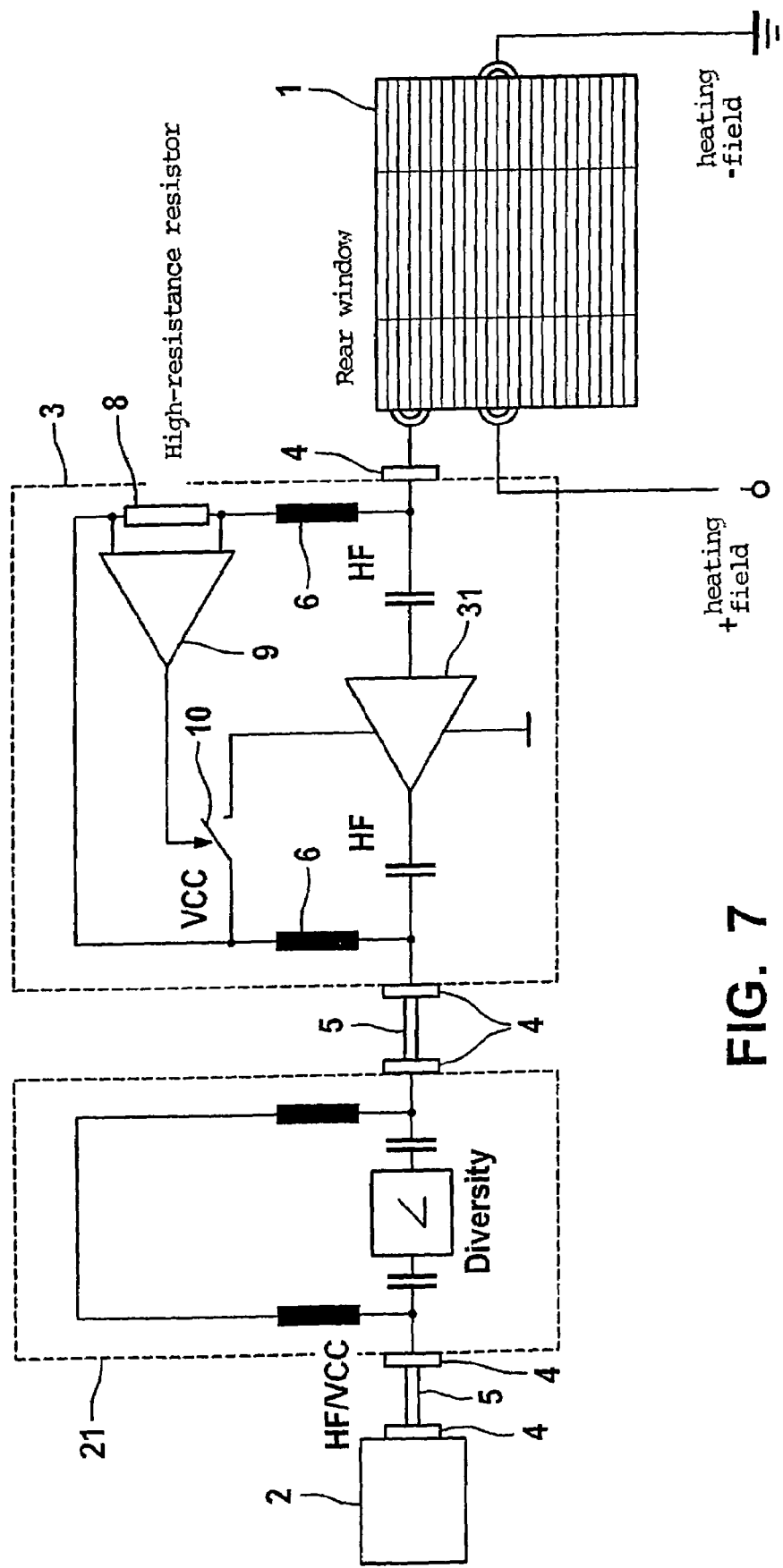
FIG. 7 shows additional alternatives to the joint monitoring of a diversity device.

FIG. 7 shows the diagnostic signal bypassing the active circuit of the upstream diversity device and the analysis of the voltage drop across diagnostic resistor 8 in adapter circuit 3 provided as in FIG. 1.

What is claimed is:

1. A diagnostic method for monitoring at least one plug-in connection to an antenna, the plug-in connection being in an antenna signal path to the antenna, comprising:
    supplying a diagnostic signal via the antenna signal path toward the antenna (1), the diagnostic signal bypassing an active circuit (31) provided in the antenna signal path,
    influencing a power supply of the active circuit (31) depending on whether the diagnostic signal is affected by an error due to the at least one plug-in connection (4), and
    detecting whether power consumption of the active circuit (31) is outside a predefined window, and if so signaling an error.

2. The diagnostic method according to claim 1, wherein the antenna is a window-integrated antenna of a vehicle.

3. The diagnostic method according to claim 1, wherein a DC power supply signal for the active circuit (31) is used as the diagnostic signal.

4. The diagnostic method according to claim 3, wherein the diagnostic signal travels through a diagnostic resistor (8); the voltage drop across the diagnostic resistor (8) is monitored; and in the event of an error at the at least one plug-in connection (4), a power supply interrupter (10) for the active circuit (31) is activated via the voltage drop across the diagnostic resistor (8).

5. The diagnostic method according to claim 3, wherein the diagnostic signal, after passing through the antenna-side plug-in connection (4), is fed back to the active circuit (31), specifically to its power supply terminal (32).

6. The diagnostic method according to claim 3, wherein the diagnostic signal bypasses a diversity device (21) provided in the antenna signal path and is subsequently fed back into the antenna signal path.

7. The diagnostic method according to claim 3, wherein the diagnostic signal is phantom-supplied via the antenna signal path and its RF cable (5).

8. The diagnostic method according to claim 1, wherein the diagnostic signal travels through a diagnostic resistor (8); the voltage drop across the diagnostic resistor (8) is monitored; and in the event of an error at the at least one plug-in connection (4), a power supply interrupter (10) for the active circuit (31) is activated via the voltage drop across the diagnostic resistor (8).

9. The diagnostic method according to claim 8, wherein the diagnostic signal bypasses a diversity device (21) provided in the antenna signal path and is subsequently fed back into the antenna signal path.

10. The diagnostic method according to claim 1, wherein the diagnostic signal, after passing through the antenna-side plug-in connection (4), is fed back to the active circuit (31), specifically to its power supply terminal (32).

11. The diagnostic method according to claim 10, wherein the diagnostic signal bypasses a diversity device (21) provided in the antenna signal path and is subsequently fed back into the antenna signal path.

12. The diagnostic method according to claim 1, wherein the diagnostic signal bypasses a diversity device (21) provided in the antenna signal path and is subsequently fed back into the antenna signal path.

13. The diagnostic method according to claim 1, wherein the diagnostic signal is phantom-supplied via the antenna signal path and its RF cable (5).

14. A diagnostic device for monitoring at least one plug-in connection to a window-integrated antenna of a vehicle, the plug-in connection being in an antenna signal path to the antenna, the device comprising:
    means for generating a diagnostic signal and for feeding this signal into the antenna signal path toward the antenna (1),
    means for enabling the diagnostic signal to bypass an active circuit (31) in the antenna signal path (31),
    means for influencing the power supply of the active circuit (31) depending on whether the diagnostic signal is affected by an error due to at least one plug-in connection (4), and
    means for detecting power consumption of the active circuit (31) and for signaling an error if the power consumption is outside a predefined window.

15. The diagnostic device according to claim 14, further comprising a diagnostic resistor (8) in a bypass branch of the active circuit (31), wherein the diagnostic resistor (8) is connected to an analyzer (9), via which a power supply interrupter (19) for the active circuit can be operated.

16. The diagnostic device according to claim 15, further comprising means for feeding back the diagnostic signal to a power supply terminal (32) of the active circuit (31) after it has passed through the antenna-side plug-in connection (4, 43).

17. The diagnostic device according to claim 14, further comprising means for feeding back the diagnostic signal to a power supply terminal (32) of the active circuit (31) after it has passed through the antenna-side plug-in connection (4, 43).

18. The diagnostic device according to claim 14, wherein a phantom supply of the diagnostic signal is provided via the antenna signal path and its RF cable (5).

19. The diagnostic device according to claim 18, wherein the phantom supply is the DC power supply signal for the active circuit (31).

* * * * *